United States Patent
Lin et al.

(10) Patent No.: US 6,864,174 B2
(45) Date of Patent: Mar. 8, 2005

(54) ITERATIVELY SELECTIVE GAS FLOW CONTROL AND DYNAMIC DATABASE TO ACHIEVE CD UNIFORMITY

(75) Inventors: Li-Te S. Lin, Hsin-Chu (TW); Yui Wang, Taichung (TW); Ming-Ching Chang, Taipei (TW); Li-Shung Chen, Hsinchu (TW); Huain-Jelin Lin, Hsin-Chu (TW); Yuan-Hong Chin, Taipei (TW); Hong-Yuan Tao, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/394,334

(22) Filed: Mar. 20, 2003

(65) Prior Publication Data

US 2004/0185584 A1 Sep. 23, 2004

(51) Int. Cl.[7] .............................................. H01L 21/302
(52) U.S. Cl. ....................... 438/689; 438/710; 438/714
(58) Field of Search ................................. 438/689, 700, 438/710, 714, 738

(56) References Cited

U.S. PATENT DOCUMENTS

| | | | | |
|---|---|---|---|---|
| 6,143,080 A | * | 11/2000 | Bartholomew et al. | 118/718 |
| 6,245,581 B1 | * | 6/2001 | Bonser et al. | 438/8 |
| 2002/0103563 A1 | * | 8/2002 | Izawa et al. | 700/121 |
| 2003/0019580 A1 | * | 1/2003 | Strang | 156/345.33 |

* cited by examiner

Primary Examiner—Hsien Ming Lee
(74) Attorney, Agent, or Firm—Tung & Associates

(57) ABSTRACT

A method for compensating for CD variations across a semiconductor process wafer surface in a plasma etching process including providing a semiconductor wafer having a process surface including photolithographically developed features imaged from a photomask; determining a first dimensional variation of the features with respect to corresponding photomask dimensions along at least one wafer surface direction to determine a first levelness of the process surface; determining gas flow parameters in a plasma reactor for a plasma etching process required to approach a level process surface by reference to an archive of previous plasma etching process parameters carried out in the plasma reactor; carrying out the plasma etching process in the plasma rector according to the determined gas flow parameters; and, determining a second dimensional variation of the features along the at least one wafer surface direction to determine a second levelness of the process surface.

16 Claims, 2 Drawing Sheets

ITERATIVELY SELECTIVE GAS FLOW CONTROL AND DYNAMIC DATABASE TO ACHIEVE CD UNIFORMITY

FIELD OF THE INVENTION

This invention generally relates to plasma reactor processes including dry etching processes and more particularly to a gas flow control system and methodology for adjusting gas flow control parameters in a plasma reactor process including selectively controllable gas flow supply pathways and/or gas flow exhaust pathways to achieve critical dimension (CD) uniformity.

BACKGROUND OF THE INVENTION

In the field of plasma (dry) etching, various processing parameters including, for example, RF power, RF bias, pressure, gas flow rate, temperature, and vacuum conditions are pre-determined in order to accomplish a particular plasma etching process. In addition, many plasma etching processes are pre-programmed to follow a series of steps for predetermined time periods also referred to as a process recipe, where the processing parameters may be altered at each step to achieve a desired etching result.

While there are several types of plasma reactor configurations including a wide variety or gaseous reactants used for etching a semiconductor wafer to form semiconductor features, all such processes are generally affected by the concentration of plasma etching species which is in turn dependent on gas supply flow rates and reactor pumping rates. In addition, dry etching processes are dependent on the amount of etchable surface exposed to the etchant (plasma etching species). Since dry etching processes are frequently carried out as steady state processes, reactive species are being created and removed at equal rates when viewed on the scale of the plasma reactor.

The overall partial pressure of the reactive species is inversely proportional to the removal rate of the reactive species which is in general largely controlled by three processes: 1) consumption by etching 2) recombination of the reactive species, and 3) pumping rate of the reactive species or removal rate from the plasma reactor chamber. In addition the partial pressure of the reactive species is directly proportional to the generation rate of the reactive species which, among other factors, is proportional to the gas flow rate. Depending on the particular etching process either the generation rate or the removal rate may have a dominant influence on the etching rate. Several factors affecting the concentration of reactive plasma species may produce etching non-uniformities over the diameter of the process wafer.

For example, one effect, known as the loading effect, occurs where the etch reaction is the dominant removal process. Since the etch reaction is proportional to the amount of etchable surface, the partial pressure of reactive species which is proportional to an etching rate is decreased by an increase in the amount of etchable surface available. Other processes, for example including chlorine atoms may be dominated by the recombination reaction of chlorine atoms to form chlorine gas and may not be affected by an increase in etchable surface area.

Gas flow non-uniformities can affect several mechanisms in dry etching by affecting the local concentration of reactive species over an etch substrate, for example a semiconductor process wafer. For example, in some configurations, more gas arriving at, for example, the process wafer edge may have a higher etch rate compared to the wafer center due to faster replenishment of reactive species at the wafer edge compared to the wafer center. Thus, critical dimension (CD) non-uniformities in semiconductor features vary concentrically from wafer center to edge. Etching non-uniformities including edge to edge non-uniformities also referred to as a leveling effect adversely affect subsequent photolithographic processes by causing defocusing difficulties in transferring mask images to the wafer surface.

A device sizes, including transistors are scaled down to below about 1 micron, CD requirements have become more stringent and difficult to control. For example, two parameters known as bias and tolerance are frequently used to define CD requirements in the semiconductor processing art. CD Bias is the difference in lateral dimension between the etched image and the mask image. CD uniformity is a measure of the statistical distribution, for example $3\times$ sigma, of CD bias values that characterized the uniformity of etching. For example, in etching polysilicon gate structures, the gate length determines the channel length and the acceptable electronic functioning of a transistor making gate CD uniformity critical in the gate formation process. Non-uniform etching rates over the diameter of the process wafer, which are frequently strongly influenced by gas flow characteristics within a plasma reactor chamber, may adversely affect the manufacture of the transistor device in several ways. For example, wafer edge-to-edge (across wafer diameter) variations in etching rates cause leveling non-uniformities which contribute to defocus in subsequent photolithographic processes. As a result, the leveling non-uniformities compound CD bias in subsequent process steps. A goal in the semiconductor manufacture process industry is to achieve CD uniformity to within less than about 30 Angstroms.

A problem in prior art etching processes and systems is the inability to quickly and reliably adjust gas flow control behavior within the plasma reactor system to achieve predictable and repeatable results. Frequently, the gas flow control adjustment process in a 'black art' limited by trial and error techniques to obtain the proper gas flow characteristics within a plasma reactor to achieve acceptable CD uniformity. Changes in one of several components of the plasma reactor system over time may unpredictably change etching rates within a plasma reactor chamber. Frequently in order to compensate for altered etching rates, gas flow characteristics must be tuned (adjusted) to compensate for such changes to achieve acceptable CD bias. However, changes in the components that control gas flow characteristics including the reactor pumping speed and/or gas flow supply system may also be affected by time dependent factors such as reactor cleanliness and reactor component aging. Further, etching parameters are frequently required to be altered from one etching process to another, making the re-establishment of optimal etching parameters including optimal gas flow characteristics time consuming and frequently limited to reliance on a trial and error approach.

According to the prior art, efforts to address etch non-uniformities have focused on adjusting the power level of the RF power antenna (excitation source), for example, in an inductively coupled plasma source, a single or dual TCP (transformer coupled plasma), typically disposed outside the reactor chamber adjacent to a dielectric window through which power is transmitted to the reactor gases. In addition, efforts have been made to gain better control of the substrate temperature, for example, by including a dual temperature control on the electrostatic chuck (ESC) that holds the substrate.

It has been found, however, that the gas transport characteristics within a plasma reactor are frequently the most sensitive variable contributing to etch non-uniformities. There have been a variety of gas feed systems proposed for plasma reactors, however many of them are unable to control gas flow characteristics over the diameter of the wafer to avoid or sufficiently compensate for etching non-uniformities. Gas feed systems for plasma reactors have included top gas feed arrangements where the gas feed is fed from the top of the reactor chamber toward the substrate surface including shower head feed arrangements centrally located at the top of the reactor chamber. Further, the prior art has disclosed gas feeds that are centrally located in the upper chamber including one or more gas feeds and which can be directed at a variety of angles generally toward the substrate surface. Gas feed systems according to the prior art, however, lack a system and methodology for selectively controlling gas feed characteristics and/or gas pumping characteristics to selectively control gas flow characteristics in a readily predictable way to compensate for etching non-uniformities. As a result, gas flow control including reactive species concentrations present at the process wafer surface is largely reliant on an uninformed trial and error approach to achieve desired etching uniformity.

Thus, there is a need in the semiconductor processing art to develop a gas flow control system and methodology for reliably adjusting gas flow characteristics within a plasma etcher to achieve repeatable and predictable etching rates including acceptable CD uniformity.

It is therefore an object of the invention to provide a gas flow control system and methodology for reliably adjusting gas flow characteristics within a plasma etcher to achieve repeatable and predictable etching rates including acceptable CD uniformity while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for compensating for CD variations across a semiconductor process wafer surface in a plasma etching process.

In a first embodiment, the method includes providing a semiconductor wafer having a process surface including photolithographically developed features imaged from a photomask; determining a first dimensional variation of the features with respect to corresponding photomask dimensions along at least one wafer surface direction to determine a first levelness of the process surface; determining gas flow parameters in a plasma reactor for a plasma etching process required to approach a level process surface by reference to an archive of previous plasma etching process parameters carried out in the plasma reactor; carrying out the plasma etching process in the plasma rector according to the determined gas flow parameters; and, determining a second dimensional variation of the features along the at least one wafer surface direction to determine a second levelness of the process surface.

These and other embodiments, aspects and features of the invention will be better understood from a detailed description of the preferred embodiments of the invention which are further described below in conjunction with the accompanying Figures.

BRIEF DESCRIPTION OF THE DRAWINGS

FIGS. 2B and 2C are a side view and a top view of a gas feed distribution plate including nozzle included in the gas flow parameter control system according to embodiments of the present invention.

DETAILED DESCRIPTION OF THE PREFERRED EMBODIMENTS

Although the system and method of the present invention are explained in exemplary implementation with respect to achieving CD uniformity of semiconductor features in a semiconductor wafer dry etching process, and in particular an edge to edge CD uniformity, it will be appreciated that the system and methodology of the present invention may be advantageously applied to a deposition process, for example a plasma enhanced chemical vapor deposition process to achieve uniform film deposition over a semiconductor process wafer.

Figure 1A:
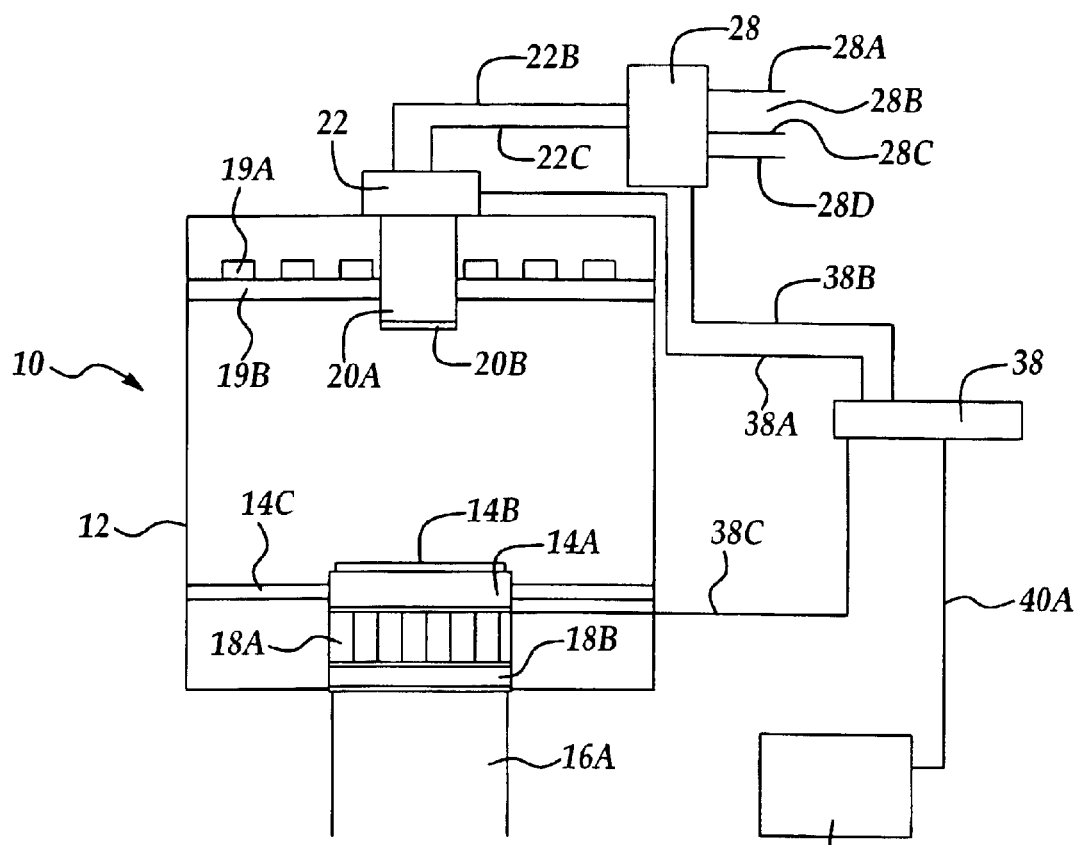
FIG. 1 is a schematic representation of an exemplary plasma reactor including a portion of the gas flow parameter control system according to embodiments of the present invention.

Referring to FIG. 1, in an exemplary implementation of the present invention, an exemplary plasma reactor 10 showing a portion of an exemplary gas flow parameter control system is shown including a reactor chamber 12. The plasma reactor 10 may include any plasma reactor including a gas flow supply to the plasma reactor, a vacuum pumping system to maintain a plasma operating pressure, and a means to ignite a plasma within the plasma reactor. The plasma reactor 10, for example, is an inductively coupled plasma (ICP) reactor or a transformer coupled plasma (TCP) reactor. A reactor chamber defined by housing 12, for example includes a wafer holding means 14A, for example an electrostatic chuck (ESC) for holding process wafer 14B disposed in the lower part of the reactor chamber 12 above a vacuum pumping pathway 16A, communicating with a vacuum pumping system, for example including one or more turbomolecular pumps e.g., (not shown), and one or more mechanical roughing pumps (not shown). The vacuum pumping pathway preferably includes a means to alter an exhaust flow opening cross section, for example a plurality of exhaust flow opening cross sections e.g., 18A, including a means to reduce the respective cross section openings leading to the pumping pathway 16A. Optionally, a plasma screen 14C is positioned across the reactor chamber 12 above the plurality of exhaust flow opening cross sections e.g., 18A. Preferably, exhaust flow opening cross sections are disposed below the wafer holding means 14A, for example over a main exhaust valve, for example a gate valve 18B, disposed in the pumping pathway 16A to open or close the pumping pathway 16A.

Figure 2A:
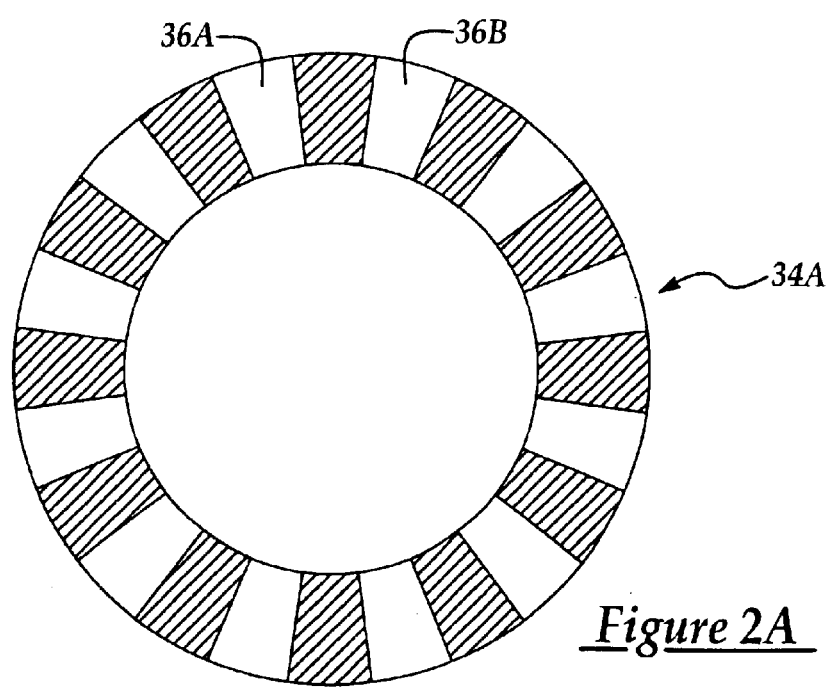
FIG. 2A is a top view of a grid of exhaust openings used for adjusting exhaust opening cross sections according to an embodiment of the present invention.

The exhaust flow opening cross sections 18A, for example, may be formed by an adjustable grid formed of adjacently disposed and overlapping rotatable collars having spaced apart openings such that one or both members may be rotatably adjusted to increase or decrease the cross section of the exhaust flow opening pathway defined according to the extent of overlap of the respective spaced apart openings. Referring to FIG. 2A, showing a top view of a rotatable collar e.g., 34A, for example, the openings, e.g., 36A and 36B formed around the circumference of the collar forming a grid of vertically extending openings in a spaced apart fan-like configuration. For example two collars are overlapped in rotatable relationship over one another and disposed in the flow pathway leading to the, for example disposed below wafer holder 14A to within pumping pathway 16A. Preferably, the plurality of openings in each of the respective collar shaped members is spaced apart in varying degrees such that exhaust cross section openings may be selectively rotatably adjusted to provide a relatively larger exhaust opening cross section along selected portions of the circumference of the collar thereby selectively changing reactive gas species concentrations over selected portions of the process wafer. Alternatively, the exhaust flow opening cross sections may be formed of a plurality of adjustable valves disposed in the exhaust flow pathway and extending around the circumference of the wafer holding member 14A, similar to the grid placement such that the individual valves may be adjusted to have variable opening cross section leading to the pumping pathway. Preferably, the plurality of adjustable valves may be selectively adjusted to provide a repeatable exhaust flow pathway extending around the circumference of the wafer holding member to thereby control a reactive species gas concentration over selected portions of the wafer surface during a plasma etching process.

Preferably, the plasma reactor includes a gas feeding means 20A, preferably disposed in an upper portion of the reactor chamber 12, and preferably including a plurality of individually gas flow rate adjustable gas feed lines for delivering selected gas flow rates to preferentially contact portions of the process wafer. For example, the gas feeding means 20A includes a gas distribution plate member 20B including a plurality gas feed orifices each individually communicating with gas flow rate controllable gas feed lines. For example, although the gas feeding means 20A is shown as a centrally located being surrounded by RF coils e.g., 19A over dielectric window 19B, and having a smaller diameter than the process wafer 14B, it will be appreciated that the gas distribution member 20B may be larger, for example extending across a projected diameter of the process wafer.

For example, briefly referring to FIG. 2B is shown an exemplary gas distribution plate member 30A, for example, formed of a dielectric insulating material, formed with a series of gas flow orifices e.g., 32A corresponding to different gas flow zones extending to the process wafer surface. For example the gas flow orifices may range from about 0.1 mm to about 1 mm. It will be appreciated that other orifice patterns may be used for different etching or deposition applications. For example, referring to FIG. 2C, a side view of a gas feeding means 30B, for example a gas nozzle including a gas distribution plate member 30C including a plurality of gas orifices similar to gas distribution plate member 30A, and including gas flow orifices e.g., 32B disposed along the outer diameter of the gas nozzle 30B for distributing gas in a radial direction within the reactor chamber to adjust gas flow patterns contacting the wafer surface.

Referring again to FIG. 1, a gas flow divider 22 is disposed upstream of gas feeding means 20A which receives a pre-mixed gas flow from one or more gas feed lines e.g., 22B and 22C. The flow divider, for example, preferably includes a means to control a flow rate to each of the gas feed lines (not shown) leading to respective gas flow orifices, one or more of which may constitute a gas feed zone. For example, the flow divider divides the one or more incoming pre-mixed gas streams into a plurality of gas feed lines including mass flow controllers for each of the respective gas feed lines to individually control a gas flow rate to the respective gas flow zones (e.g., one or more orifices in the gas distribution plate member e.g., 20B.

Still referring to FIG. 1, a gas supply panel 28 including a plurality of gas supply lines e.g., 28A, 28B, 28C, and 28D, from gas supply sources (not shown) is provided for controllably supplying the individual reactive gases. For example each of the gas supply lines supplying gas panel 28 preferably includes a respective pressure control means (not shown) and mass flow controller (not shown) for controllably supplying the individual reactive gases to the gas supply panel where the individual gases are pre-mixed for delivery to at least one of gas supply lines 22D and 22C. It will be appreciated that gas mixers may be provided downstream of the gas panel 28 for thoroughly mixing unreactive precursor gases, for example in an etching or deposition process prior to feeding them to the gas flow divider 22.

Preferably, the gas flow rate control means, for example including gas flow divider 22 and gas control panel 28 including gas supply valves to control supply and flow rates of the individual process gases to the reactor chamber 12A are in programmable communication with a controller 38, e.g., by means of communication lines 38A and 38B. In addition, preferably, the exhaust flow cross sectional openings are in adjustable and programmable communication with the controller 38 for increasing or decreasing a cross sectional exhaust flow area leading to the pumping pathway, for example by means of communication line 38C. In addition, preferably, the vacuum pumping means (not shown) is in responsive and programmable communication with the controller for controlling a pumping speed. Moreover, preferably, other plasma process parameters for carrying out an etching or deposition process, for example, RF power, RF bias, and temperature are in programmable and responsive communication with the controller 28. By programmable and responsive communication is meant preferably two-way communication with the controller for sending and receiving data communications. For example, instrument control communication interfaces including for example, IEEE-488, GP-IB, RS-232 communication hardware and protocol may be used for communication with the controller. It will be appreciated that wireless communication protocol and hardware may be used as well. For example the controller 38 may be in communication with a server e.g., 40 by means of communication line 40A including at least a computer readable storage media and a processor for processing computer readable instructions in the form of a computer program for plasma reactor process control. Preferably the server 40 includes a graphical user interface (not shown). For example the process control programs may include batch operation mode and real-time interactive operation mode including a graphical user interface where independent process variables may be selectively altered or overridden in real time. It will be appreciated that the controller, server, and graphical user interface may be disposed remotely from one another or may be included in a combined configuration.

According to one embodiment of the present invention, a semiconductor process wafer is subjected to a photolithographic patterning process. Following development of the photoresist, a first set of critical dimension (CD) measurements are performed on the patterned semiconductor features over predetermined areas of the process wafer surface and entered into a database, preferably a relational database, associated with the particular process wafer orientation and photomask used to pattern the semiconductor features. For example, a first set of CD variation values for each predetermined measurement area is determined by a programmed set of instructions to determine a mathematical relationship representing a CD variation, for example an absolute difference and/or a ratio associated with a distance along at least one direction across the process wafer of each of the first set of CD measurements compared to reference CD values determined from the photomask pattern. A CD variation may be further processed by known methods to create a CD map, for example a 3-dimensional CD variation map. The CD variation data is used to determine a desired levelness factor (measure of CD variation from edge to edge across the wafer) and a leveling factor representing the desired change in the edge to edge CD variation or degree of flatness with distance along at least one direction of the process wafer surface, preferably forming a grid of measurement areas over the process wafer surface. The desired leveling factor represents the change in levelness required of the process wafer, or in other words, to achieve a CD variation within a predetermined CD variation window. In addition, a desired leveling factor may be associated with a predetermined orientation of the process wafer, for example with respect to a selected first X and Y axis intersecting at the wafer center.

For example, it has been found that an important factor affecting CD uniformity includes CD variations across the diameter of the wafer (edge to edge) which can be correlated with wafer process surfaces that are out of flatness (unlevel). The unlevel wafer surface contributes to defocusing in the photolithographic patterning step which produces feature dimensional variations, for example CD variations with respect to reference photomask dimensions. The CD variations are determined by a first set of CD measurements over predetermined areas of the process wafer surface, for example by conventional optical microscope and/or scanning electron microscopic examination following the photoresist development process. A first set of CD variation values, for example, can be associated with a CD levelness factor determined by comparing the first set of CD measurements to target CD values obtained from the photolithographic mask. Following determination of the magnitude and variation with direction of the CD levelness factor from edge-to edge across a diameter of the process wafer surface, gas flow parameters, preferably included in a relational database, is queried to determine appropriate gas flow parameters, preferably including at least one of, and preferably both, gas supply flow rates and exhaust gas flow parameters to create an appropriate reactor gas flow pattern in a subsequent plasma etching process to compensate (e.g., make level) for a given CD levelness factor present following the photolithographic process. For example, concentrations of reactive species in the plasma process may be varied across the diameter of the process surface by selectively controlling gas supply flow rates directed to portions of the wafer surface and/or by altering exhaust gas flow patterns. As a result, the etching rate may be altered across the diameter of the wafer, for example having a faster etching rate in one area of the process wafer compared to another, for example where the plasma etching rate is selectively controlled to occur at a relatively higher rate over a wafer area having a relatively higher CD variation value (level) compared to a wafer area having a relatively lower CD variation value (level), thus compensating for the CD levelness factor to achieve a CD variation within a predetermined variation window representing a second levelness factor (compensated leveling) following the plasma etching process.

Preferably, the relational database to be queried to determine appropriate gas flow parameters required to achieve compensated leveling across a diameter of the wafer surface, for example, achieving a CD variation within a predetermined CD variation window. The desired levelness factor to be achieved can be represented by a relative CD variation change in magnitude and distance along a given direction and is hereinafter also referred to as a leveling factor. For example, a preprogrammed set of instructions determines the desired or targeted leveling factor by determining a desired change in CD variation with respect to distance along a given direction across the wafer surface to achieve a desired targeted CD variation within a predetermined CD variation window (levelness factor).

Another preprogrammed set of instructions then queries the relational database to determine gas flow parameters associated with archived leveling factors from previous plasma etching processes that most closely produces the targeted leveling factor. For example, a closest fit representing minimized differences between supplied and reference data in the database can be determined by a least squares analysis or non-linear least square analysis of supplied data representing a desired change in CD variation with respect to reference plasma processes giving an actual change in CD variation. For example, the archived leveling factor is associated with at least one of a second x axis and y axis orientation of the wafer as positioned in the plasma reactor chamber. The targeted leveling factor is associated with at least one of a first x axis and y axis orientation of the process wafer selectively associated with the process wafer during or following determination of the first set of CD variation values following the photolithographic development process. The archive leveling factors associated with plasma etching parameters including gas flow parameters are preferably determined from previous plasma etching processes where each process is associated with a leveling factor determined from a change in a first set of CD measurements obtained following a photolithographic development process with respect to a second set of CD measurements obtained following a plasma etching process. The CD measurements may be mathematically transformed into other values, for example CD variation values, including for example 3× sigma values associated with a plurality of CD variation measurements made at one or more locations at the process wafer surface. The mathematically transformed values may in turn be used for determining targeted and archived levelness and leveling factors.

Following determination of the archived leveling factor to achieve a targeted leveling factor corresponding to a desired levelness factor together with associated gas flow parameters, the process wafer is oriented in the plasma reactor to correspond to the orientation associated with the determined gas flow parameters and a plasma etching process is carried out using the determined plasma etching parameters including gas flow parameters. Following the plasma etching process, a third set of CD measurements are taken at predetermined areas of the wafer, similar to the first and second set of CD measurements, and entered into the relational database including optional preprogrammed mathematical transformations, such as determining CD variations across at least one process wafer diameter and determining resulting levelness and leveling factors with respect to pre-etching CD measurements and entered (fed forward) into the relational database.

For example, the database may be continually expanded with newly fed-forward CD measurement data and leveling factors following a plasma etching process or such data may be updated by replacing older data associated with a plasma etching process with more recent data associated with a more recent plasma etching process, for example, assuming the respective plasma etching parameters are otherwise equivalent.

Figure 3:
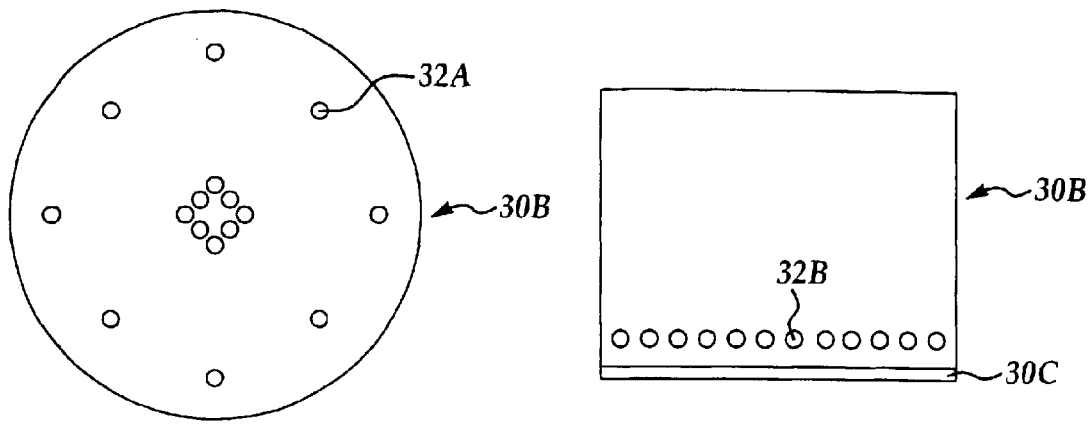
FIG. 3 is a process flow diagram including several embodiments of the method of the present invention.
Figure 3:
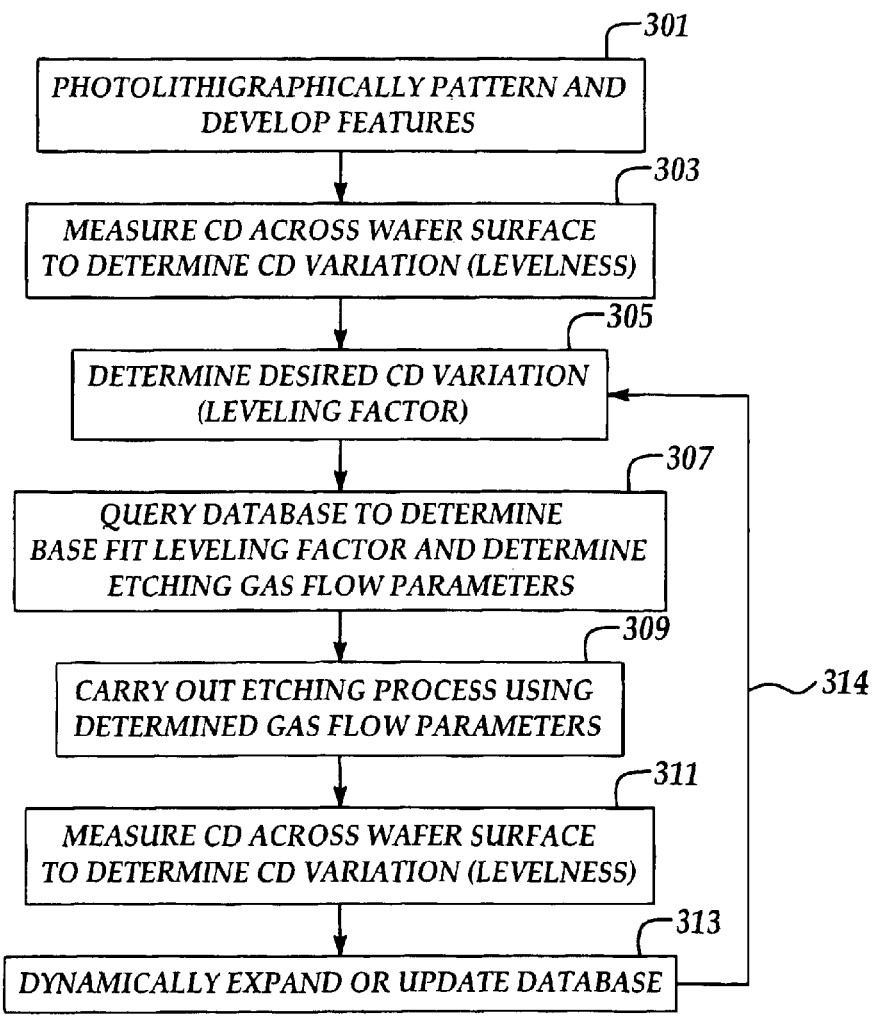

Referring to FIG. 3 is shown a process flow diagram including several embodiments of the present invention. In process 301 a photolithographic process is carried out. In process 303, a CD measurement process is carried out over predetermined areas of the process wafer surface. In process 305 values representing a CD variation along a predetermined wafer direction and including a wafer levelness (levelness factor) and desired change in levelness (leveling factor) are determined. In process 307, a relational database of plasma etching parameters including gas flow parameters for previously carried out plasma etching processes is queried to determine gas flow parameters associated with a best fit to a desired leveling factor. In process 309, a plasma etching process is carried out using the gas flow parameters associated with the desired leveling factor. In process 311, a second CD measurement process is carried out over predetermined areas of the process wafer surface including determining values representing a CD variation along at least one wafer direction, preferably including a grid of measurement areas, to determine a levelness and a resulting leveling factor achieved with respect to a pre-etching condition. In process 313, the CD variation data including levelness and leveling factors together with associated plasma process parameters including gas flow parameters are entered into the database to expand or update the database. Optionally, if the resulting CD variation is not within a predetermined CD variation window (e.g., levelness factor) a new leveling factor to achieve a levelness factor is determined and the process beginning with process 305 as indicated by process directional arrow 314 is repeated.

Thus a method has been provided to compensate for CD variations associated with an unlevel wafer process surface by determining appropriate gas flow parameters to achieve a more level wafer process surface from a dynamically updated relational database including leveling factors associated with previous plasma etching processes and gas flow parameters. As a result, gas flow parameters for achieving a desired CD variation across a wafer surface can be easily and quickly determined eliminating a blind trial and error approach. In addition, by dynamically updating the database, time dependent variations in plasma etching rates due to variations in plasma etching parameters including gas flow rates are accounted for, making the control of CD uniformity in a plasma etching process more predictable and reliable.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for compensating for CD variations across a semiconductor process wafer surface diameter in a photolithographic patterning and plasma etching process comprising the steps of:

providing a semiconductor process wafer having a process surface comprising photolithographically developed features imaged from a photomask for forming etched features;

determining a first dimensional variation of the photolithographically developed features with respect to corresponding photomask dimensions along at least one wafer surface direction comprising a diameter of the process surface;

determining gas flow parameters in a plasma reactor for a plasma etching process required to approach a targeted dimensional variation of the etched features by reference to an archive of previous plasma etching process parameters including gas flow parameters carried out in the plasma reactor;

carrying out the plasma etching process in the plasma reactor to form the etched features according to the determined gas flow parameters selected from the group consisting of gas supply flow parameters and exhaust flow parameters to alter an etching rate over the diameter; and, determining a second dimensional variation of the etched features along the at least one wafer surface direction.

2. The method of claim 1, further comprising adding the results of the second dimensional variation in association with the plasma etching process parameters including the gas flow parameters to the archive of previous plasma etching process parameters.

3. The method of claim 1, wherein the steps of determining gas flow parameters, carrying out a plasma etching process, and determining a second dimensional variation are repeated to approach the targeted dimensional variation of the etched features.

4. The method of claim 1, wherein the gas supply flow parameters comprise a gas flow rate for each of a plurality individually gas flow rate adjustable gas supply flow feed lines provided to preferentially deliver a gas flow to portions of the process surface.

5. The method of claim 1, wherein the exhaust flow parameters comprise a plurality of individually adjustable exhaust flow pathway opening cross sections to vary a gas flow pattern over portions of the process surface.

6. The method of claim 1, wherein the step of determining gas flow parameters comprises querying a database including the previous plasma etching process parameters in responsive communication with a controller.

7. The method of claim 6, wherein the step of querying a database further comprises supplying a first set of data comprising a desired change in the first dimensional variation.

8. The method of claim 7, wherein the step of querying a database further comprises comparing the first set of data to a second set of data comprising the etched feature dimensional variation changes according to the previous plasma process parameters including the gas flow parameters.

9. The method of claim 8, wherein comparing comprises minimizing a difference between the first set of data and the second set of data.

10. The method of claim 9, wherein minimizing a difference comprises a methodology selected from the group consisting of a linear and non-linear least squares analysis.

11. A method for compensating for CD variations across a semiconductor process wafer surface to achieve CD uniformity across a process surface diameter in a photolithographic patterning and plasma etching process comprising the steps of:

providing a semiconductor process wafer having a process surface including a plurality of photolithographically patterned features each having a critical dimension (CD);

determining a first CD variation along at least one wafer surface direction comprising the process surface diameter;

determining gas flow parameters required in a plasma reactor for carrying out a plasma etching process to produce a targeted CD variation within a predetermined CD variation window by reference to an archive of previous plasma etching process parameters carried out in the plasma reactor;

carrying out the plasma etching process in the plasma reactor according to the determined gas flow parameters comprising gas supply and gas exhaust flow parameters to alter an etching rate across the process surface diameter; and, determining a second CD variation along the at least one wafer surface direction; and, adding the results of the second CD variation in association with at least the gas flow parameters to the archive of previous plasma etching process parameters; and, repeating the steps of determining gas flow parameters, carrying out a plasma etching process, and determining a second CD variation to approach the targeted CD variation.

12. The method of claim 11, wherein the gas flow parameters comprise gas supply flow rates and exhaust flow pathway opening cross sections to vary an etching rate over portions of the process surface.

13. The method of claim 12, wherein the gas supply flow rates comprises a selectively controllable gas flow rate for each of a plurality of individually gas supply feed lines provided to preferentially deliver a gas flow to portions of the process surface.

14. The method of claim 12, wherein the exhaust flow pathway opening cross sections include a plurality of individually adjustable exhaust flow pathway opening cross sections to vary a gas flow pattern over portions of the process surface.

15. The method of claim 11, wherein the step of determining gas flow parameters comprises querying a database including the previous gas flow parameters in responsive communication with a controller.

16. The method of claim 15, wherein the step of querying a database further comprises supplying a first set of data comprising a desired change in the first CD variation for comparison to data comprising CD variation changes.

* * * * *